US008874987B2

United States Patent
Djordjevic et al.

(10) Patent No.: US 8,874,987 B2
(45) Date of Patent: Oct. 28, 2014

(54) OPTIMUM SIGNAL CONSTELLATION DESIGN FOR HIGH-SPEED OPTICAL TRANSMISSION

(71) Applicant: NEC Laboratories America, Inc., Princeton, NJ (US)

(72) Inventors: Ivan B. Djordjevic, Tucson, AZ (US); Lei Xu, Princeton Junction, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 139 days.

(21) Appl. No.: 13/646,454

(22) Filed: Oct. 5, 2012

(65) Prior Publication Data

US 2013/0091398 A1 Apr. 11, 2013

Related U.S. Application Data

(60) Provisional application No. 61/543,876, filed on Oct. 6, 2011.

(51) Int. Cl.
*H03M 13/00* (2006.01)
*H04L 1/00* (2006.01)
(Continued)

(52) U.S. Cl.
CPC ............ *H04L 1/0057* (2013.01); *H04L 1/0003* (2013.01); *H03M 13/3905* (2013.01); *H03M 13/2957* (2013.01); *H03M 13/3972* (2013.01); (Continued)

(58) Field of Classification Search
CPC .. G11B 7/005; G11B 7/0065; G11B 7/00772; G11B 7/126; H03C 7/025; H04J 14/06; H04J 14/00; H04L 25/03197; H04L 27/362; H04L 7/007; H04L 1/0057; H04N 19/00569; H04N 1/4052; H04N 21/2383; H04N 21/4382; H04N 9/14; H03M 13/116; H03M 13/255; H03M 13/2957; H03M 13/3905; H03M 13/3972; H03M 13/6331; H04B 10/532; H04B 10/58; H04B 10/6161; H04B 1/0475; H04B 1/10
USPC .................. 714/E11.032, 752, 758, 755, 786; 375/341, 240, 240.03, 240.1, 240.14, 375/240.23, 240.27, 295, 296, 298, 350
See application file for complete search history.

(56) References Cited

U.S. PATENT DOCUMENTS 6,831,526 B2 * 12/2004 Sadowy et al. ............... 332/103
2006/0274861 A1 * 12/2006 Langenbach et al. ......... 375/341

(Continued)

OTHER PUBLICATIONS

Arabaci, et al., "Four-Dimensional Nonbinary LDPC-Coded Modulation Schemes for Ultra-High-Speed Optical Fiber Communication", IEEE Photonics Technology Letters, vol. 23, No. 18, Sep. 15, 2011, pp. 1280-1282.

(Continued)

*Primary Examiner* — Guy Lamarre
(74) *Attorney, Agent, or Firm* — Joseph Kolodka

(57) ABSTRACT

Systems and methods for data transport, comprising encoding one or more streams of input data with one or more low density parity check (LDPC) encoders, corresponding to one or more polarization/spatial mode branches. One or more encoded data streams are mapped to symbols, wherein the mapper is configured to assign bits of the symbols to a signal constellation and to associate the bits of the symbols with signal constellation points. A signal constellation is formulated which minimizes a mean-square error of the signal constellation representing the source. The optimum signal constellation size is adjusted to improve transmission quality by adjusting the signal constellation an optical signal to noise ratio (OSNR), wherein the signal constellation is selected using a look-up table (LUT); and the symbols are modulated in accordance with the output of the mapper onto a transmission medium.

7 Claims, 7 Drawing Sheets

(51) Int. Cl.
  H03M 13/11 (2006.01)
  H03M 13/25 (2006.01)
  H04J 14/06 (2006.01)
  H03M 13/39 (2006.01)
  H03M 13/29 (2006.01)

(52) U.S. Cl.
  CPC .......... *H03M 13/116* (2013.01); *H03M 13/255* (2013.01); *H04J 14/06* (2013.01); *H03M 13/6331* (2013.01)
  USPC .................. 714/755; 714/758; 714/E11.032; 714/786; 375/240.27; 324/76.36

(56) References Cited

U.S. PATENT DOCUMENTS

2009/0219577 A1* 9/2009 Couwenhoven et al. .... 358/3.03
2010/0329315 A1* 12/2010 Sergeev et al. ................ 375/220

OTHER PUBLICATIONS

Magarini, et al. Concatenated Coded Modulation for Optical Communications Systems, IEEE Photonics Technology Letters, vol. 22, No. 16, Aug. 15, 2010, pp. 1244-1246.

Batshon, Hussam G., "Interactive Polar Quantization-Based Modulation to Achieve Channel Capacity in Ultrahigh-Speed Optical Communication Systems", IEEE Photonics Journal, vol. 2, No. 4, Aug. 2010, pp. 593-599.

Benedetto, et al., "Trellis Coded Polarization Shift Keying Modulation for Digital Optical Communications", IEEE Transactions on Communications, vol. 43, No. 2/3/4, Feb./Mar./Apr. 1995, pp. 1591-1602.

Bulow, et al., "Soft Coded Modulation for Sensitivity Enhancement of Coherent 100-Gbit/s Transmission Systems", Optical Society of America, 2009, 3 Pages.

Chang, et al., "On Calculating the Capacity of an Infinite-Input Finite (Infinite)—Output Channel", IEE Transactions on Information Theory, vol. 34, No. 5., Sep. 1988, pp. 1004-1010.

Djordjevic, et al., "Next Generation FEC for High-Capacity Communication in Optical Transport Networks", Journal of Lightwave Technology, vol. 27, No. 16, Aug. 15, 2009, pp. 3518-3530.

Djordjevic, et al., "Surpression of Fiber Nonlinearities and PMD in Coded-Modulation Schemes With Coherent Detection by Using Turbo Equalization", Optical Society of America, vol. 1, No. 6, Nov. 2009, pp. 555-564.

Essiambre, et al. "Capacity Limits of Fiber Networks", Journal of Lightwave Technology, vol. 28, No. 4, Feb. 15, 2010, pp. 662-701.

Liu, et al. "Generation and FEC-Decoding of a 231.5-Gb/s PDM-OFDM Signal with 256-Interactive-Polar-Modulation Acheiving 11.15-b/s Hz Intrachannel Spectral Efficiency and 800-km Reach", Optical Society of America, 2012, 3 Pages.

Ungerboeck, "Channel Coding with Multilevel/Phase Signals", IEEE Transactions of Information Theory, vol. IT-28, No. 1, Jan. 1982, pp. 55-67.

Winzer, et al., "Beyond 100G Ethernet", IEEE Communications Magazine, Jul. 2012, pp. 26-30.

Zhang, et al. "Optimized Four-Dimensional Mapping for High-Speed Optical Communication Systems", Optical Society of America, Technology Digest, 2012, Jan. 23, 2012, 3 Pages.

* cited by examiner

OPTIMUM SIGNAL CONSTELLATION DESIGN FOR HIGH-SPEED OPTICAL TRANSMISSION

RELATED APPLICATION INFORMATION

This application claims priority to provisional application Ser. No. 61/543,876 filed on Oct. 6, 2011, incorporated herein by reference. This application is related to a non-provisional application, U.S. Ser. No. 13/646,392, filed on Oct. 5, 2012, and incorporated by reference herein.

BACKGROUND

1. Technical Field

The present invention relates to coded modulation and more particularly to determining the optimum signal constellation in the minimum mean-square error (MMSE) sense for a low-density parity-check-coded modulation (LDPC-CM) scheme based on MMSE-optimum signal constellation design (MMSE-OSCD).

2. Description of the Related Art

Due to the rapid growth of data-centric services and the general deployment of broadband access networks in recent years, there has been an elevated demand driving the dense wavelength division multiplexing (DWDM) network upgrade from 10 Gb/s per channel to more spectrally-efficient channel transmission rates. However, as the symbol rate increases, the deteriorating effects of linear and nonlinear fiber impairments are known to exacerbate. For example, as the communication rate over a given medium increases, transmission becomes increasingly sensitive to errors due to various linear and nonlinear channel impairments such as chromatic dispersion, PMD and fiber nonlinearities. The Shannon limit for a noise-influenced channel describes a maximum amount of error-free data that can be transmitted with a specified bandwidth—it is therefore helpful to have robust codes and modulation schemes that closely approach the Shannon limit without imposing high requirements in terms of implementation cost and complexity.

Bit interleaved (BI) low-density parity-check (LDPC) coded modulation (CM) based on large girth LDPC codes provides excellent performance, but requires code rate and bandwidth to increase in order to compensate for information loss due to coding. Meanwhile, quasi-cyclic (QC) LDPC codes are easy to implement, but this comes at the expense of performance. Large-girth QC-LDPC codes provide good bit-error rate (BER) performance, but require excessive code-word length for larger girths, as the code rate, and therefore the bandwidth, must increase to compensate for information loss due to coding. Another approach used to enable higher speed data transport is the concatenation of trellis-coded modulation (TCM) (initially introduced for wire-line transmissions) with an outer interleaved Bose-Chaudhuri-Hocquenghem (BCH) code. The performance of systems using BCH-TCM lags far behind that of systems using LDPC codes, at least in part because those systems use weak convolutional codes.

SUMMARY

A method for data transport, comprising encoding one or more streams of input data with one or more low density parity check (LDPC) encoders, corresponding to one or more polarization/spatial mode branches; mapping one or more encoded data streams to symbols, wherein the mapper is configured to assign bits of the symbols to a signal constellation and to associate the bits of the symbols with signal constellation points; formulating a signal constellation which minimizes a mean-square error of the signal constellation; adjusting the signal constellation size to improve transmission quality by selecting the signal constellation in accordance to channel optical signal-to-noise ratio (OSNR), wherein the signal constellation is selected using a look-up table (LUT); and modulating the symbols in accordance with the output of the mapper onto a transmission medium by means of I/Q modulators.

A method for receiving data, comprising receiving a modulated, encoded input stream; detecting symbols from the modulated, encoded input stream, wherein the modulated, encoded input stream is received for an expanded signal constellation selected using a look-up table (LUT); performing reduced complexity coarse digital backpropagation with a minimal number of coefficients, thereby minimizing the complexity of a maximum a posteriori probability (MAP) equalizer; equalizing the input stream using the MAP equalizer; and decoding the stream of encoded data with a plurality of low density parity check (LDPC) decoders.

A transmitter, comprising one or more low density parity check (LDPC) encoders, corresponding to one or more polarization/spatial mode branches, configured to encode one or more streams of input data; a mapper configured to map one or more encoded data streams to symbols by assigning bits of the symbols to a signal constellation and associating the bits of the symbols with signal constellation points; a signal constellation which minimizes mean-square error (MSE), wherein the signal constellation size is adjusted to improve transmission quality by adjusting the signal constellations size based on channel optical signal-to-noise ratio (OSNR), wherein the signal constellation is selected using a look-up table (LUT); an adaptive optical transport based on an feedback channel capacity inspired optimum signal constellation design (FCC-OSCD) method; and a 4-dimensional (4-D) modulator configured to modulate the symbols in accordance with the output of the mapper onto a transmission medium.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
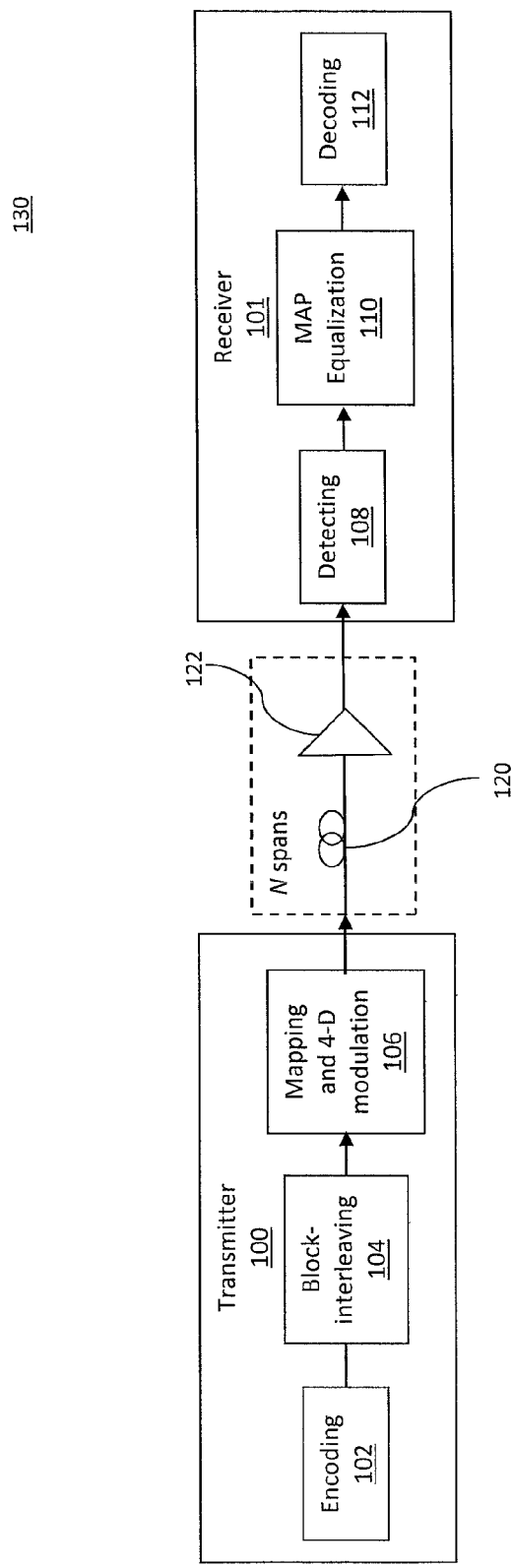
FIG. 1 is a block/flow diagram illustrating a system/method for optical data transmission that employs polarization-division multiplexed (PDM) low density parity check-coded modulation (LDPC-CM) based on a minimum mean-square error-optimum signal constellation design (MMSE-OSCD)

In accordance with the present principles, systems and methods are provided to enable ultra-high speed serial transmission (e.g., beyond 400 Gb/s) using a polarization division multiplexed (PDM) coded-modulation scheme based on signal constellations obtained by minimization of the mean-square error (MSE) of signal constellations representing the source for the optimum source distribution. In one embodiment, the optimum source distribution is obtained by maximizing the channel capacity, based on the Arimoto-Blahut algorithm for a given finite-input finite-output channel. The Arimoto-Blahut algorithm may be employed to iterate probability mass functions to achieve convergence and optimum source distribution. Therefore, these signal constellations are optimum in the minimum MSE (MMSE) sense, and the method formulated in accordance with the present principles is thus named the MMSE-optimum signal constellation design (OSCD) method. In another embodiment, the optical SNR (OSNR), estimated on the receiver by monitoring circuit, is employed as feedback to the transmitter, which adjusts the signal constellation according to the channel conditions. This scheme is referred to as the feedback channel capacity inspired OSCD (FCC-OSCD).

The efficiency of the method is demonstrated by observing an amplified spontaneous emission (ASE) noise dominated scenario. In this scenario, reduced complexity coarse digital back-propagation (with a reasonably small number of coefficients) is combined with sliding-window turbo equalization. Monte Carlo simulations performed using the MMSE-OSCD in accordance with the present principles show that the signal constellations obtained by the MMSE-OSCD method significantly outperform conventional QAM signal constellations (e.g., ~1 dB for 16-ary MMSE-OSCD constellation over 16-QAM at the same BER). The FCC-OSCD method also significantly outperforms conventional QAM signal constellations (e.g., ~1.2 dB improvement over 16-QAM at the same BER). The MMSE/FCC-OSCD in accordance with the present principles also significantly outperforms iterative polar quantization (IPQ) signal constellations for medium signal constellation sizes (e.g., a 32-ary signal constellation, obtained by FCC-OSCD, outperforms an optimized 32-ary CIPQ signal constellation by 0.8 dB at BER of $10^{-7}$).

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now in detail to the figures in which like numerals represent the same or similar elements and initially to FIG. 1, an optical communication system 130 is illustratively shown having a transmitter 100 and a receiver 101. Although the transmitter 100 and the receiver 101 are both illustratively shown, one skilled in the art would appreciate that the transmitter 100 or receiver 101 may each be employed separately, or in combination with each other in accordance with the present principles. The transmitter 100 encodes a plurality of data signals at an encoding block 102 and then interleaves those signals at a block interleaving block 104. The mapping block 106 then assigns bits of the interleaved signal to a minimum mean square error-optimum signal constellation design (MMSE-OSCD) signal constellation. The mapper in block 106 will be described in more detail below. In one embodiment, two independent LDPC-coded OSCD-based data streams are polarization multiplexed.

A 4-dimentional (4-D) modulator is employed in block 106, and includes a polarization beam splitter (PBS), two I/Q modulators and a polarization beam combiner (PBC). A 4-D modulator may be employed to increase the aggregate data rate by employing energy-efficient constellations in 4D space, while keeping the symbol rate reasonable low. A benefit of employing the 4D signal constellation rather than a conventional two-dimensional (2D) constellation is an improvement in optical signal-to-noise ratio (OSNR) sensitivity. Although a 4-D modulator is advantageously employed in accordance with the present principles, it is contemplated that other sorts of modulators may be used.

In one embodiment according to the present principles, signal generation may be separated into two distinct parts: modulation, which is a discrete set of values called the signal constellation; and pulse shaping which may be employed to create the pulse waveforms. The size of the constellation determines the maximum information that each symbol can carry, while pulse shaping affects the spectral width occupied by the signal. A data symbol may be defined as any N-dimensional real vector. A signal constellation is a set of M vectors, and the corresponding set of modulated waveforms is a signal set. In one embodiment, a modulator may be employed to construct a modulated waveform from a set of data symbols, wherein each distinct point in a signal constellation corresponds to a different modulated waveform, and the occurrence of a particular data symbol in a constellation determines the probability of the $i^{th}$ vector.

The transmitter 100 then sends the signal to a receiver 101 over a transmission medium 120 (e.g., optical), which may include one or more erbium doped fiber amplifiers (EDFA) 122 to maintain signal strength. Although the EDFAs are advantageously employed in accordance with the present principles, it is contemplated that other sorts of amplifiers may be employed. The receiver 101 detects symbols in the MMSE/FCC-OSCD constellation at block 108. A backpropagation and equalization block 110 performs reduced complexity coarse digital backpropagation and turbo equalization to compensate for channel impairments. The signals are then de-interleaved and decoded at block 112 to produce the original data signals. In one embodiment employing a FCC-OSCD scheme according to the present principles, the OSNR is monitored on the receiver side 101, and the information obtained is used on the transmitter side 100 to adapt the signal constellation according to a channel OSNR.

Figure 2:
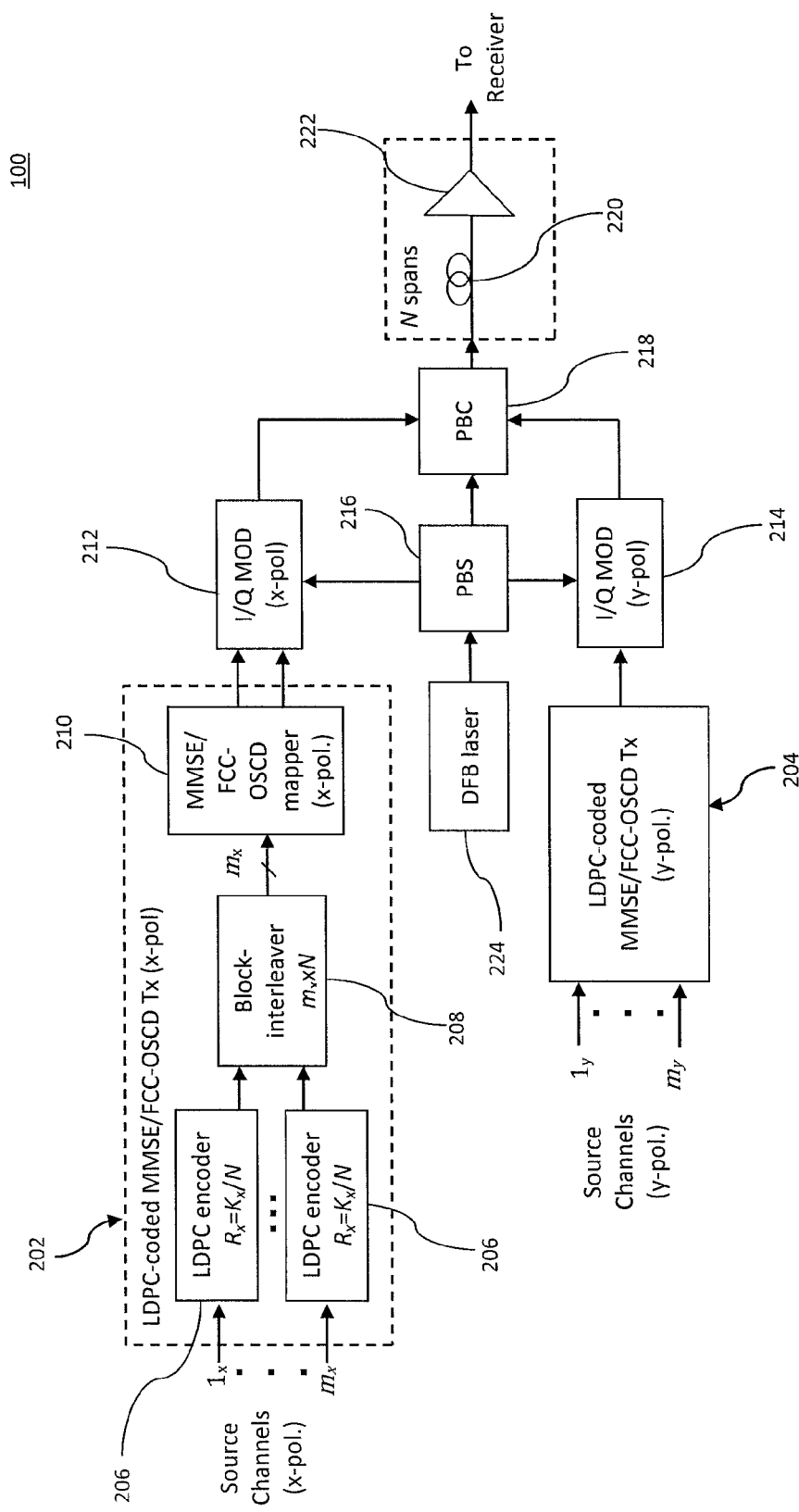
FIG. 2 is a block/flow diagram illustrating a system/method for an optical transmitter based on LDPC-coded MMSE-OSCD signal constellations in accordance with one embodiment.

Referring now to FIG. 2, a detailed view of the transmitter configuration 100 is shown for a polarization-multiplexed LDPC-coded scheme based on MMSE/FCC-OSCD signal constellations, with LDPC-coded MMSE/FCC-OSCD transmitters (Tx) 202 and 204, for x- and y-polarizations, respectively, in accordance with the present principles. There are $m_x+m_y$ independent source channels, where subscripts x and y correspond to x- and y-polarizations, respectively. Although x- and y-polarizations are illustratively shown, it is contemplated that other orthogonal polarizations and signal constellation sizes may be employed in accordance with the present principles. In one embodiment, this scheme can be used in combination with few-mode fibers (FMF) employing mode-multiplexing. According to another embodiment, the configurations of the LDPC-coded MMSE/FCC-OSCD transmitters (Tx) are identical for both polarizations. As such, details are illustratively provided below only for the x-polarization 202.

One or more data streams are used in the x-polarized Tx 202, and are encoded using $[N,K_x]$ binary LDPC codes of code rate $R_x=K_x/N$ at block 206. Outputs of the encoders 206 are written row-wise into a block-interleaver 208, and m, bits are taken column-wise from the interleaver 208. The output of the interleaver 208 is sent to a MMSE/FCC-OSCD mapper 210. In one embodiment, the m bits are used to select coordinates from a MMSE-OSCD $2^{m_x}$-ary signal constellation implemented as a look-up-table (LUT). In another embodiment, the FCC-OSCD scheme is adaptive, based on received estimate of OSNR, and the corresponding signal constellation is chosen from a LUT.

In one embodiment in accordance with the present principles, 3-5 OSNR dependent OSCD constellations are stored in a LUT for adaptation purposes. After pulse shaping, the LUT coordinates are used as inputs to one or more I/Q modulators (I/Q MOD) 212 and 214 corresponding to x- and y-polarizations, respectively. In one embodiment, a distributed feedback (DFB) laser 224 is provided as an optical source, and the output of the DFB laser 224 has its polarization separated by a polarization beam splitter (PBS) 216. The independent polarization data streams corresponding to x- and y-polarizations are combined into a single optical signal by a polarization beam combiner (PBC) 218, and are then transmitted over an optical communication system of interest using an optical fiber 220, and may use one or more erbium doped fiber amplifiers (EDFAs) 222 to maintain signal strength. In FMF links, an addition mode multiplexer (not shown) is used to multiplex several polarization multiplexed data streams.

Figure 3:
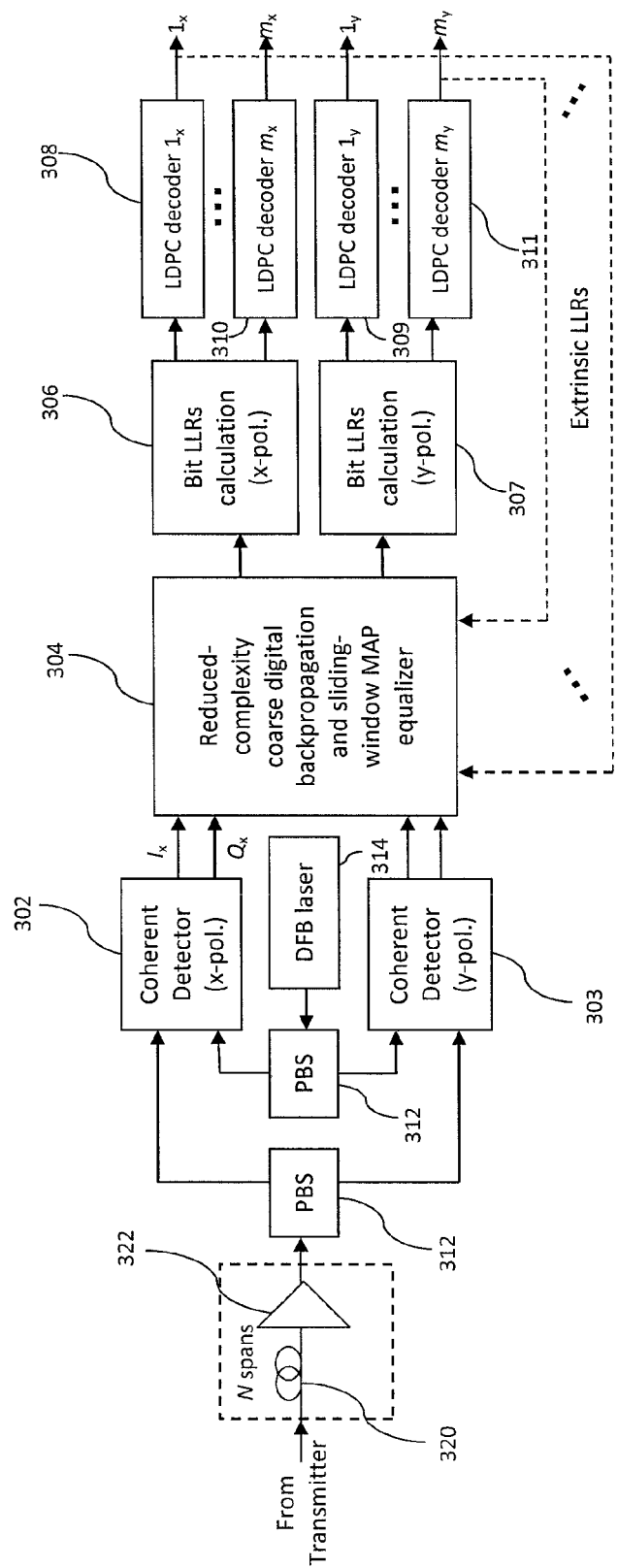
FIG. 3 is a block diagram illustrating a system/method for an optical receiver based on LDPC-coded MMSE-OSCD signal constellations in accordance with one embodiment.

Referring now to FIG. 3, a detailed view of the receiver configuration 101 is shown for a polarization-multiplexed LDPC-coded scheme based on MMSE/FCC-OSCD signal constellations in accordance with the present principles. In an illustrative embodiment, a polarization-diversity receiver is used as the receiver 101, however it is contemplated that other sorts of receivers may be used according to the present principles. In an FCC scheme, a portion of a received signal is tapped to estimate OSNR, and this information is employed as feedback to the transmitter (not shown), which adjusts the OSCD constellation.

In one embodiment, a carrier beam is received from an optical fiber 320 and is split by a polarization beam splitter (PBS) 312. Detectors 302 and 303, each corresponding to x-polarization and y-polarization, respectively, demodulate the beams, and the output from the detectors 302 and 303 provide estimates of in-phase (I) and quadrature (Q) coordinates for both polarizations. Although the detectors 302 and 303 are advantageously implemented as balanced coherent detectors and optical single-mode fiber (SMF) is illustratively employed, it is contemplated that other sorts of detectors and media may be employed in accordance with the present principles. For example, few-mode fiber, few-core fibers, few-mode-few-core fibers and multimode fibers can also be employed in accordance with the present principles. In these embodiments, an additional mode multiplexer is employed on the transmitter side (not shown), and an additional mode demultiplexer is employed on the receiver side 101. A local laser source 306 may be used as an optical source to provide the detectors 302 and 303 with a local reference that allows them to quickly distinguish between the orthogonal polarizations and extract the information.

In one embodiment, reduced complexity coarse digital back-propagation is used for dispersion management in block 304, and is implemented with a small number of coefficients to reduce the channel memory so that the complexity of a sliding-window MAP equalizer 304 that follows is not too high. The sliding-window MAP equalizer 304 provides soft symbol log-likelihood ratios (LLRs), which are used to calculate bit LLRs 306 and 307, for x- and y-polarizations, respectively, which are further passed to a plurality of LDPC decoders in blocks 308, 309, 310, and 311. Although x- and y-polarizations are illustratively shown, it is contemplated that other polarizations may be employed in accordance with the present principles. In one embodiment, a turbo equalization principle is used, and the LDPC codes are based on quasi-cyclic (QC) LDPC coded design of large girth. The aggregate data rate of this embodiment is $(m_xR_x+m_yR_y) R_s$, where $R_s$ is the symbol rate.

Figure 4:
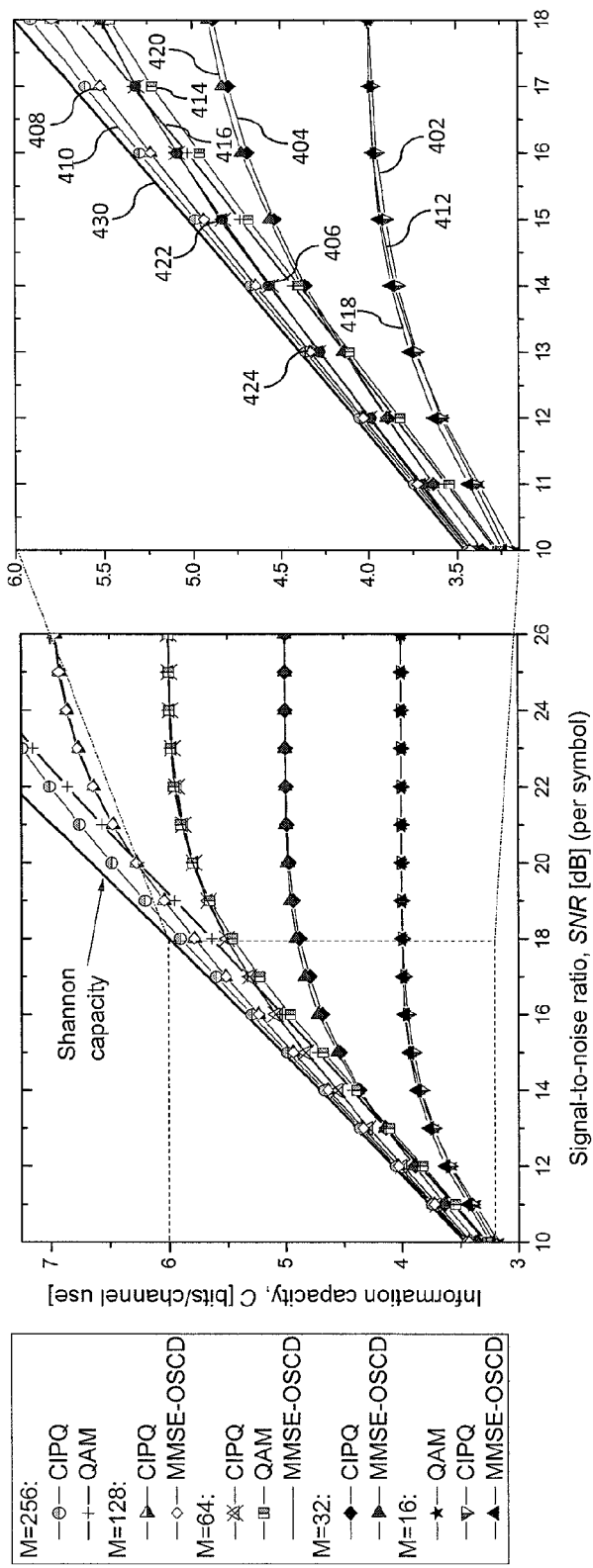
FIG. 4 is a plot of information capacities of MMSE-OSCD based signal constellations against quadrature amplitude modulation (QAM) and centered iterative polar quantization (CIPQ) in accordance with one embodiment.

Referring now to FIG. 4, a plot of information capacities of MMSE-OSCD based signal constellations against quadrature amplitude modulation (QAM) and centered iterative polar quantization (CIPQ) is illustratively shown in accordance with an illustrative embodiment. A polarization-multiplexed LDPC-coded MMSE-OSCD scheme according to the present principles allows for beyond 400 Gb/s serial optical transport. The plot in FIG. 4 shows information capacities for signal constellations according to the present principles and compares them with that of quadrature amplitude modulation (QAM) and iterative polar quantization (IPQ) (including a point, placed in the center, denoted as CIPQ). The signal constellations obtained by the MMSE-OSCD method significantly outperform both QAM and IPQ-inspired signal constellations containing a point located in the origin. In one embodiment according to the present principles, a signal constellation may be constructed by mapping each symbol $c_k$ to 4-D constellation points by $s_k=u(c_k)$, where u is a mapping rule, and $s_k$ is the corresponding signal constellation point selected from a $2^m$-ary 4D constellation, and m denotes the number of bits per symbol $c_k$.

For example, in one embodiment according to the present principles, an expanded view of a portion of a plot for the information capacities of signal constellations accord is shown. The expanded views are shown for CIPQ based signal constellations 402, 404, 406, 408, and 410 with signal constellation sizes of 16, 32, 64, 128, and 256 respectively; for QAM based signal constellations 412, 414, and 416 with signal constellation sizes of 16, 64, and 256, respectively; and for MMSE-OSCD based signal constellations 418, 420, 422, and 424 with signal constellation sizes of 16, 32, 64, and 128, respectively. A plot of the Shannon capacity 430 is also shown for reference. Although the above-mentioned signal constellation sizes are illustratively shown, it is contemplated that other signal constellation sizes may also be employed in accordance with the present principles.

As shown in FIG. 4, it is clear that MMSE-OSCD signal constellations outperform QAM and CIPQ constellations for all constellation sizes, and outperform QAM and CIPQ to an even higher degree for small and medium sized signal constellation sizes. For example, the CIPQ approach uses approximations to come up with closed form solutions, which are valid assumptions for reasonably large signal constellation sizes, but which provide for a suboptimum solution for small and medium signal constellation sizes. For example, in an illustrative embodiment, it is shown that the 32-ary MMSE-OSCD substantially outperforms 64-QAM, in terms of information capacity, for signal-to-noise interference ratios (SNRs)≤13.5 dB.

Figure 5:
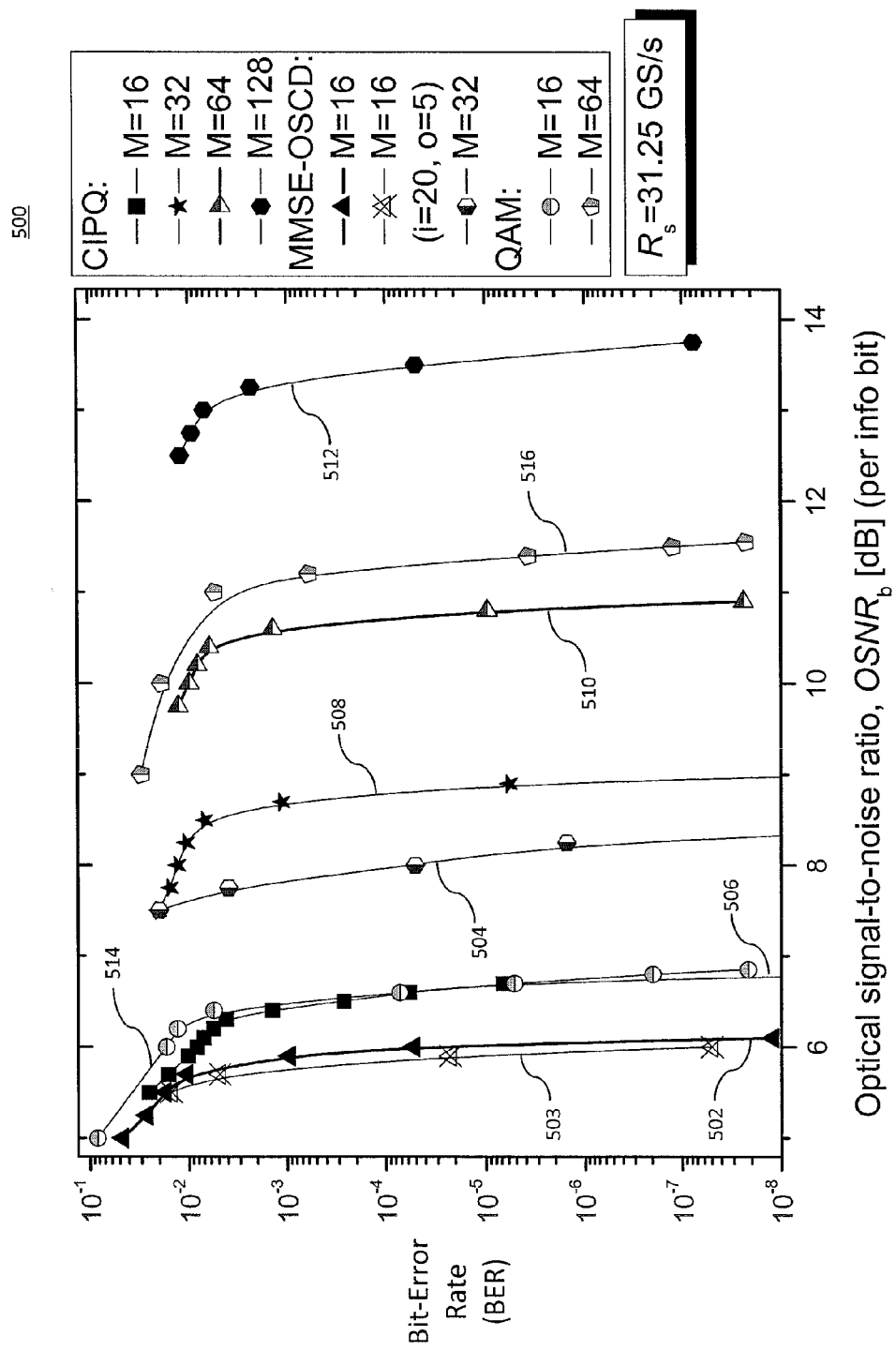
FIG. 5 is a plot of bit error rate (BER) versus signal to noise ratio (SNR) showing performance of MMSE-OSCD, QAM, and CIPQ based signal constellations in accordance with one embodiment.

Referring now to FIG. 5, results of Monte Carlo simulations 500 are shown for various signal constellation sizes, illustrating the BER performance of MMSE-OSCD based signal constellations against QAM and CIPQ, where M is the signal constellation size. The results of the simulations are obtained for 25 LDPC decoder (inner) iterations and 3 maximum a posteriori probability (MAP)-LDPC (outer) iterations, except for a 16-ary MMSE-OSCD (i=20, o=5) curve, which is obtained for 20 inner and 5 outer iterations. In accordance with the present principles, the largest improvement is obtained for 16-ary MMSE-OSCD, and at the BER of $10^{-8}$ the improvement is nearly 1 dB over 16-QAM. In an illustrative embodiment, the channel symbol rate is set to 31.25 GS/s, and a quasi-cyclic (QC) LDPC (16935, 13550) of girth-8 and column weight-3 is illustratively employed.

Monte Carlo simulations for MMSE-OSCD based signal constellations 502 and 503 are illustratively shown for a signal constellation size of 16 (with each curve representing a different number of iterations), and an MMSE-OSCD based signal constellation 504 for a signal constellation size of 32; CIPQ based signal constellations 506, 508, 510, and 512, are shown for signal constellation sizes of 16, 32, 64, and 128, respectively; and QAM based signal constellations 514 and 516 are shown for signal constellation sizes of 16 and 64, respectively. In accordance with the present principles, and as shown in FIG. 5, MMSE-OSCD constellations outperform QAM and CIPQ constellations for all constellation sizes, and the improvement of MMSE-OSCD over CIPQ and QAM increases as the signal constellation size decreases.

Figure 6:
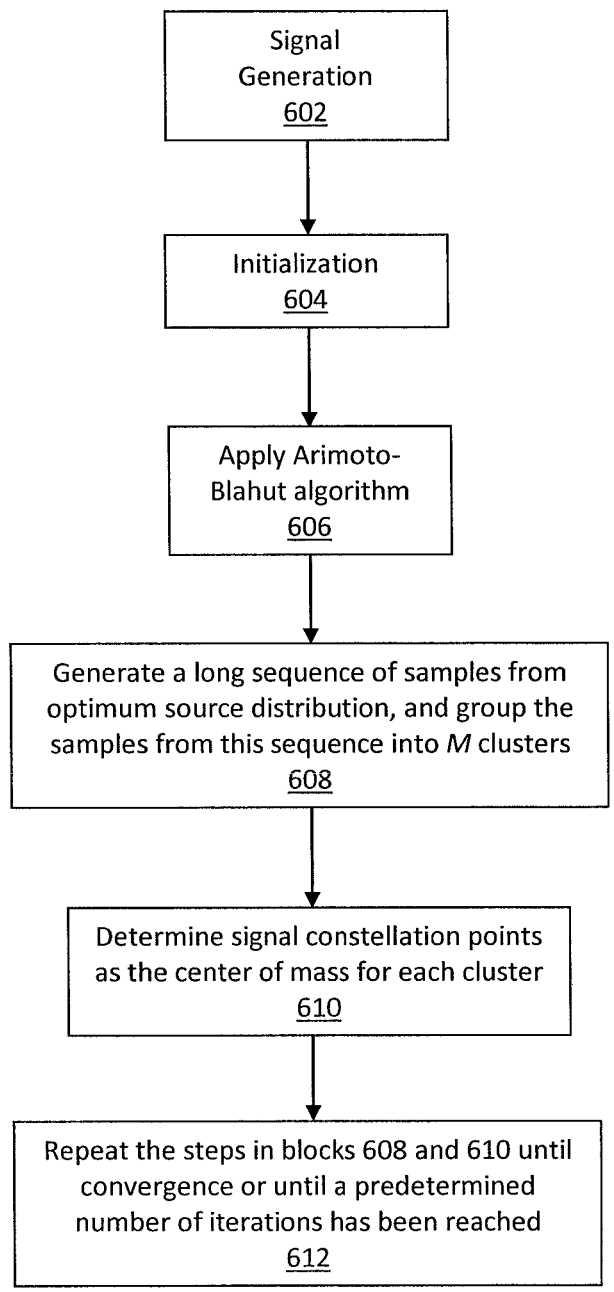
FIG. 6 is a block/flow diagram illustrating a system/method for formulating an OSCD in accordance with the present principles.

Referring now to FIG. 6, a block/flow diagram for a system/method for formulating an optimum signal constellation design for high speed optical transmissions 600 is shown. In one embodiment, the optimum signal constellation design is achieved by minimizing MSE of a source signal constellation representation. A signal is generated in block 602. Initialization then occurs in block 604. In an illustrative embodiment, QAM signal constellations may be used for initialization, but it is contemplated that other sorts of signal constellations may be used. During the initialization in block 604, an arbitrary auxiliary input distribution and signal constellation is chosen for a constellation size of M.

The first stage in the MMSE-OSCD method according to one embodiment involves applying an Arimoto-Blahut algorithm to determine an optimum source distribution for a given optical channel in block 606. This source distribution maximizes channel capacity. While this algorithm is advantageously implemented as the Arimoto-Blahut algorithm, it is contemplated that other sorts of algorithms may be employed. Long sequences of samples are then generated from the optimum source distribution in block 608, and the samples from this sequence are grouped into M clusters. Membership to the M clusters in block 608 is determined based on the Euclidean distance squared of sample points and signal constellation points from a previous iteration. In block 610, new signal constellation points are obtained as the center of mass for each cluster obtained in block 606, and each sample point is assigned to the cluster with the smallest distance squared. The steps in blocks 608 and 610 are then repeated in block 612 until convergence or until a predetermined number of iterations been reached.

Although the system/method for formulating an optimum signal constellation design for high speed optical transmissions 600 is illustratively shown as a MMSE-OSCD, it is contemplated that other sorts of OSCDs may be employed. For example, in another embodiment, the optimum signal constellation design is achieved by employing a feedback channel capacity (FCC)-OSCD method, which is formulated in stages. In the first stage, the optimum source distribution is determined using an Arimoto-Blahut algorithm in block 606, which is based on conditional probability density functions obtained by a sufficiently long training sequence in block 608. While this algorithm is advantageously implemented as the Arimoto-Blahut algorithm, it is contemplated that other sorts of algorithms may be employed in accordance with the present principles.

In one embodiment according to the present principles, an arbitrarily sized signal constellation is chosen as an initial signal constellation, and a desired signal constellation size of size M is set in an initial phase. A long training sequence from optimum source distribution for a given OSNR is then generated in block 608, and the generated samples are split into M clusters based on a minimum Euclidean distance (i.e., maximum log-likelihood function for non-Gaussian channels) from signal constellation points obtained in a previous iteration in block 608. In block 610, signal constellation points in the current iteration are obtained as a center of mass of cluster points. The steps in blocks 608 and 610 are iterated for different OSNR values until an MSE of optimum source representation falls below a target MSE (not shown).

Figure 7:
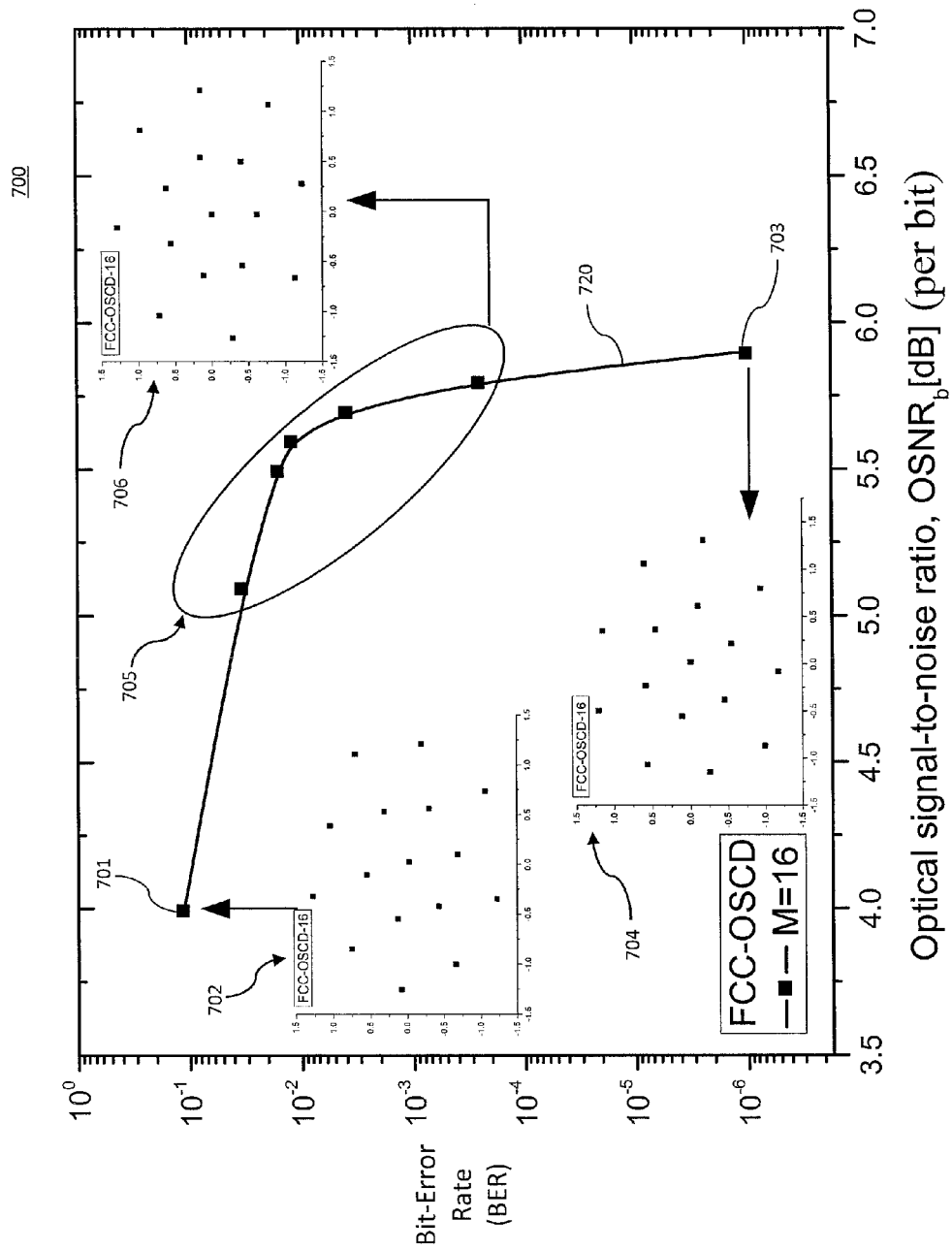
FIG. 7 is a plot of bit error rate (BER) versus optical signal to noise ratio (OSNR) for feedback channel capacity (FCC)-OSCD based signal constellations.

Referring now to FIG. 7, a plot of bit error rate (BER) versus optical signal to noise ratio (OSNR) 700 is shown for feedback channel capacity (FCC)-OSCD based signal constellations. In an illustrative embodiment according to the present principles, three different constellations are employed for a plurality of OSNRs. A signal constellation is illustratively shown for low OSNR values 702 (representing a simulation point 701 on the BER vs. OSNR curve 720), for medium OSNR values 706 (representing simulation points 705 on the BER vs. OSNR curve 720), and for high OSNR values 704 (representing a simulation point 703 on the BER vs. OSNR curve 720). In an illustrative embodiment according to the present principles, FCC-OSCD employs a signal constellation that is optimum for each OSNR.

For example, in one embodiment according to the present principles, the OSNR is estimated using the monitoring channels at the receiver side, and this information is utilized on the transmitter side to select a signal constellation that represents the best match to the current channel conditions, which is illustrated using an LDPC (16935, 13550) code with a signal constellation size of 16. For different OSNRs, different constellations are employed in the simulation to improve the OSNR sensitivity and lower the bit error rate. In one embodiment, the 16-FCC-OSCD constellations with different OSNRs 702, 704, and 706 are distinct. The number of constellation points in an inner circle of a given signal constellation changes with the OSNR value (e.g., for ONSRs below 5 dB (e.g., 702), the number of points is six; for OSNRs in the range of 5-5.5 dB (e.g., 706) the number of points is seven, and for OSNRs≥5.75 dB (e.g., 704) the number of points is six. In one embodiment, and as shown in FIG. 7, the coordinates of optimum constellations change slowly as the OSNR increases, which allows the three optimum constellations shown 702, 704, and 706 to advantageously cover the entire OSNR range.

Having described preferred embodiments of an optimum signal constellation design for high-speed optical transmission (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer implemented method for data transport, comprising:
   encoding one or more streams of input data with one or more low density parity check (LDPC) encoders, corresponding to one or more polarization/spatial mode branches;
   mapping one or more encoded data streams to symbols, wherein the mapper is configured to assign bits of the symbols to a signal constellation and to associate the bits of the symbols with signal constellation points;
   minimizing a mean-square error of the signal constellation;
   selecting the signal constellation in accordance with channel optical signal-to-noise ratio (OSNR) using a look-up table (LUT); and
   modulating the symbols in accordance with the output of the mapper onto a transmission medium by means of I/O modulators.

2. The method of claim 1, wherein the mapper performs the steps of a minimum mean square error-optimum signal constellation design (MMSE-OSCD) method, wherein the method further comprises:
   applying an Arimoto-Blahut algorithm to determine optimum source distribution;
   generating a sequence of samples from the optimum source distribution;
   grouping the sequence of samples from the sequence into M clusters;
   assigning sample points to the cluster with a smallest distance squared;
   determining signal constellation points as a center of mass for each cluster; and
   repeating said steps until convergence or until a predetermined number of iterations have been reached.

3. The method of claim 1, wherein the mapper performs the steps of a feedback channel capacity inspired optimum signal constellation design (FCC-OSCD) method, wherein the method further comprises:
   generating a training sequence from an optimum source distribution for a given optical signal-to-noise ratio (OSNR) using an Arimoto-Blahut algorithm;
   splitting a generated training sequence into M clusters based on a minimum Euclidean distance from signal constellation points obtained in a previous iteration;
   obtaining signal points in a current iteration as center of mass of cluster points;
   iterating the generated training sequence and the obtaining signal points until a minimum square error (MSE) of optimum source representation falls below a target MSE, wherein the procedure is repeated for different optical signal to noise ratio (OSNR) values;
   formulating an adaptive polarization-division multiplexed coded-modulation scheme based on the FCC-OSCD; and
   selecting, using a mapper, a corresponding optimum signal constellation design (OSCD) signal constellation based on an OSNR estimate obtained from a monitoring circuit.

4. A transmitter, comprising:
   one or more low density parity check (LDPC) encoders, corresponding to one or more polarization/spatial mode branches, configured to encode one or more streams of input data;
   a mapper configured to map one or more encoded data streams to symbols by assigning bits of the symbols to a signal constellation and associating the bits of the symbols with signal constellation points;
   a signal constellation block which minimizes mean-square error (MSE), wherein a signal constellation size is adjusted to improve transmission quality by adjusting the signal constellations size based on channel optical signal-to-noise ratio (OSNR), wherein the signal constellation is selected using a look-up table (LUT);
   an adaptive optical transport block based on an feedback channel capacity inspired optimum signal constellation design (FCC-OSCD) method; and
   a 4-dimensional (4-D) modulator configured to modulate the symbols in accordance with the output of the mapper onto a transmission medium.

5. The transmitter of claim 4, wherein the mapper is at least one of a minimum mean square error-optimum signal constellation design (MMSE-OSCD) mapper and an feedback capacity channel inspired optimum signal constellation design (FCC-OSCD).

6. The transmitter of claim 4, wherein the transmission medium is an optical transmission medium.

7. The transmitter of claim 4, further comprising a receiver adapted to work with the transmitter to decode MMSE/FCC-OSCD mapped data, the receiver further comprising:
   one or more detectors, corresponding to one or more polarization/spatial mode branches, configured to receive a modulated, encoded input stream and detect symbols in the input stream;
   a reduced complexity coarse digital backpropagation module with a minimal number of coefficients to minimize the complexity of a maximum a posteriori probability (MAP) equalizer;
   the MAP equalizer configured to equalize the input stream; and
   a plurality of low density parity check (LDPC) decoders configured to decode the stream of encoded data.

* * * * *